United States Patent
Ogiwara

(10) Patent No.: US 12,107,598 B2
(45) Date of Patent: Oct. 1, 2024

(54) DATA ACQUISITION DEVICE

(71) Applicant: Honda Motor Co., Ltd., Tokyo (JP)

(72) Inventor: Shun Ogiwara, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 268 days.

(21) Appl. No.: 17/948,237

(22) Filed: Sep. 20, 2022

(65) Prior Publication Data

US 2023/0170917 A1    Jun. 1, 2023

(30) Foreign Application Priority Data

Dec. 1, 2021  (JP) ................................ 2021-195627

(51) Int. Cl.
*H03M 1/66* (2006.01)
*H03M 1/14* (2006.01)

(52) U.S. Cl.
CPC ............. *H03M 1/662* (2013.01); *H03M 1/14* (2013.01)

(58) Field of Classification Search
CPC ........... G06N 3/08; G06N 3/02; G06N 5/046; G06Q 10/0633; G06Q 10/0631; G06Q 10/10

See application file for complete search history.

(56) References Cited

U.S. PATENT DOCUMENTS

| 2005/0184894 A1* | 8/2005 | Ando .................. H03M 1/1225 341/155 |
| 2012/0075137 A1* | 3/2012 | Tanizawa ............ H03M 1/0621 341/157 |
| 2019/0033431 A1* | 1/2019 | Haneda .................. G01S 17/06 |

FOREIGN PATENT DOCUMENTS

| JP | H1162689 | 3/1999 |
| JP | 2017103660 | 6/2017 |

* cited by examiner

Primary Examiner — Jean B Jeanglaude
(74) Attorney, Agent, or Firm — JCIPRNET

(57) ABSTRACT

The disclosure provides a data acquisition device. The data acquisition device includes a sensor that detects a physical quantity as analog data; a digital storage circuit that stores the physical quantity as digital data; a difference circuit that calculates a difference between a previous value of the physical quantity stored in the digital storage circuit and a current value of the physical quantity detected as analog data; and a comparison circuit that compares the difference with a predetermined threshold value; and a control unit. The control unit stores a value calculated by adding or subtracting a predetermined change amount to a previous value of the physical quantity stored in the digital storage circuit as the current value, when the difference exceeds or falls below the threshold value. Since the physical quantity is updated without executing A/D conversion, a decrease in the sampling frequency is suppressed.

15 Claims, 4 Drawing Sheets

DATA ACQUISITION DEVICE

CROSS-REFERENCE TO RELATED APPLICATION

This application climates the priority benefits of Japanese application no. 2021-195627, filed on Dec. 1, 2021. The entity of the above-mentioned patent application is hereby incorporated by reference herein and made a part of this specialization.

BACKGROUND

Technical Field

The disclosure relates to a data acquisition device, and more particularly to a data acquisition device that acquires digital data from analog data.

Related Art

As an engine control circuit for controlling engine operation, there is one known which includes an A/D converter that converts an output voltage of a sensor into analog/digital (Patent Literature 1). This engine control circuit reads a current A/D conversion value output from the A/D converter every predetermined time, and calculates a difference between an absolute value of a difference between a previous A/D conversion value and a current A/D conversion value and an absolute value of a difference between an A/D conversion value before last and the previous A/D conversion value. Then, if this difference is equal to or less than a determination value, the engine control circuit determines that the current A/D conversion value is not a noise, and updates an input value with the current A/D conversion value. If this difference is larger than the determination value, the engine control circuit determines that the current A/D conversion value may be noise, and keeps the previous input value as it is without updating the input value. Further, this engine control circuit includes a multiplexer, and sensor signals from a plurality of sensors are selected by the multiplexer and read via an A/D converter.

Moreover, as an A/D conversion circuit device capable of suppressing problems due to sudden changes in the analog signal, there is one known which includes a comparison unit that compares a temperature detection signal (analog signal) from a temperature sensor with a D/A conversion voltage from a D/A converter, and a processing unit (control unit) that performs determination processing based on a comparison result of the comparison unit, and obtains a A/D conversion result such that the change of the current A/D conversion result with respect to the previous A/D conversion result is equal to or less than a predetermined value based on the determination processing (Patent Literature 2).

CITATION LIST

Patent Literature

[Patent Literature 1] Japanese Unexamined Patent Publication No. 1999-62689
[Patent Literature 2] Japanese Unexamined Patent Publication No. 2017-103660

Problems to be Solved

However, conventional A/D conversion circuit device converts all analog signals into digital signals to obtain an A/D conversion result (i.e. digital data). Therefore, if the time required for A/D conversion is long, the sampling frequency decreases. As a result, when the digital data of the A/D conversion circuit device is used for controlling robot, the responsiveness of the robot deteriorates. Further, when the determination processing and the decision processing of a current final result data are executed for all the digital data so as to calculate the digital data, the processing load of the control unit becomes high. This results in high power consumption as well as high temperature in the control unit.

To be specific, when analog data from a large number of sensors is input, the time required for A/D conversion becomes longer in proportion to the number of data, and the sampling cycle of each sensor becomes longer. Although the sampling cycle may be shortened by reducing the number of sensors, the distribution density of the sensors becomes sparse and the spatial resolution deteriorates. That is, there is a trade-off relationship between shortening the sampling cycle and improving spatial resolution, and it has been difficult to achieve both.

In view of such a background, it is an object of the disclosure to provide a data acquisition device capable of suppressing a decrease in sampling frequency and reducing a processing load of a control unit.

SUMMARY

Means for Solving the Problems

To solve such a problem, an embodiment of the disclosure provides a data acquisition device (1), including: at least one sensor (7) that detects a predetermined physical quantity (i.e. pressure) as analog data (voltage); an analog storage circuit (15) that stores the physical quantity as analog data; a digital storage circuit (14) that stores the physical quantity as digital data; a first difference circuit (16, 26) that calculates a first difference ($\Delta V1$ ($=Vn-Vn-1$)), which is a difference of a current value (Vn) of the physical quantity detected as analog data with respect to a previous value (Vn−1) of the physical quantity stored in the analog storage circuit; a second difference circuit (17, 26) that calculates a second difference ($\Delta V2$ ($=Vn-1-Vn=-\Delta V1$)), which is a difference of the previous value (Vn−1) of the physical quantity stored in the analog storage circuit with respect to the current value (Vn) of the physical quantity detected as analog data; a comparison circuit (18, 19, 27) that compares the first difference with a predetermined first threshold value (Vt1) and compares the second difference with a predetermined second threshold value (Vt2); and a control unit (13) that controls a memory of the digital storage circuit. The control unit adds a preset change amount (Vc1) to a previous value of the physical quantity stored in the digital storage circuit (ST13), and stores a calculated value in the digital storage circuit as a current value of the physical quantity (ST6), when the first difference exceeds the first threshold value (ST12: Yes); subtracts a preset second change amount (Vc2) from the previous value of the physical quantity stored in the digital storage circuit (ST15), and stores a calculated value in the digital storage circuit as the current value of the physical quantity (ST6), when the second difference falls below the second threshold value (ST14: Yes); and retains the previous value of the physical quantity stored in the digital storage circuit in the digital storage circuit as the current value of the physical quantity (ST16), when the first difference is equal to or less than the first threshold value (ST12: No) and the second difference is equal to or greater than the second threshold value (ST14: No).

In the above configuration, an A/D converter (12) that converts analog data into digital data is further provided. At startup (ST4: Yes), the control unit makes the A/D converter execute A/D conversion (ST6), converts the current value of the physical quantity detected as analog data into digital data, and stores a converted value in the digital storage circuit as the current value of the physical quantity (ST7).

In the above configuration, at a predetermined timing after startup (ST11: Yes), the control unit makes the A/D converter execute A/D conversion (ST6), converts the current value of the physical quantity detected as analog data into digital data, and, by storing a converted value in the digital storage circuit as the current value of the physical quantity, corrects the value stored in the digital storage circuit (ST7).

Instead of the control unit making the A/D converter execute A/D conversion at startup, the digital storage circuit may store a preset initial value of the physical quantity.

In the above configuration, the first change amount (Vc1) is the first threshold value (Vt1), and the second change amount (Vc2) is a value (−Vt2) obtained by inverting a polarity of the second threshold value (Vt2).

The control unit updates the current value of the physical quantity stored in the analog storage circuit with the current value of the physical quantity calculated to be stored in the digital storage circuit (ST8).

In the above configuration, the first threshold value (Vt1) and the second threshold value (Vt2) are values whose absolute values are the same as each other and whose polarities are different from each other (Vt1=−Vt2=Vt), and the first difference circuit and the second difference circuit are absolute value circuits (26) that calculate an absolute value (|ΔV|) of the difference between the current value of the physical quantity detected as analog data and the previous value of the physical quantity stored in the analog storage circuit.

In the above configuration, the control unit may change at least one of the first threshold value and the second threshold value (ST10) according to a predetermined condition (ST9: Yes).

In the above configuration, the at least one sensor includes a sensor unit (6) including a plurality of the sensors (7) connected to the analog storage circuit via a multiplexer (9), the analog storage circuit stores the physical quantity for each sensor, and the control unit switches the multiplexer in synchronization with switching of the physical quantity provided to the first difference circuit and the second difference circuit (ST2).

DESCRIPTION OF THE EMBODIMENTS

Hereinafter, embodiments of the disclosure will be described in detail with reference to the drawings.

First Embodiment

Figure 1:
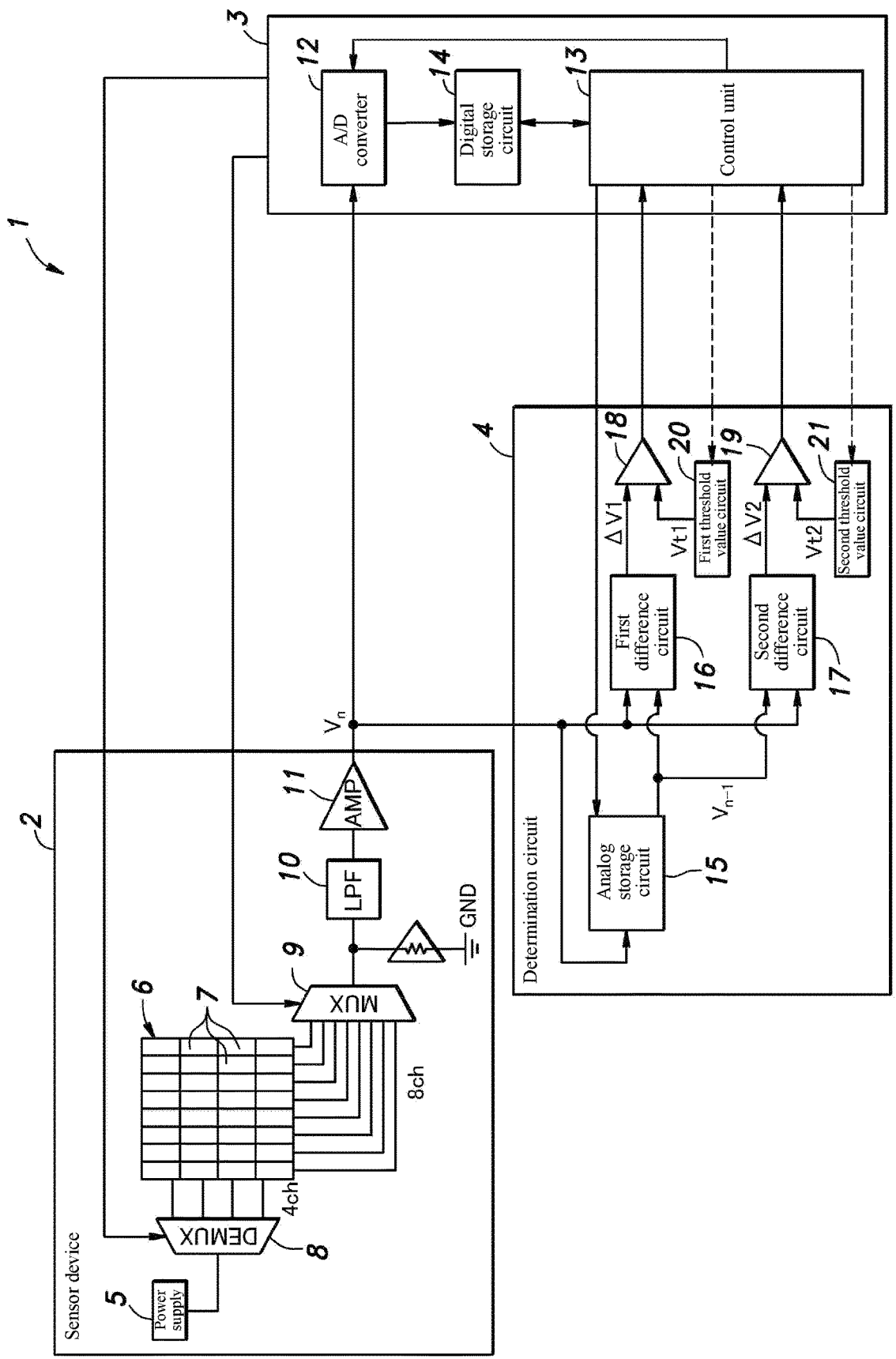
FIG. 1 is a block diagram showing a schematic configuration of a data acquisition device according to a first embodiment.
Figure 2:
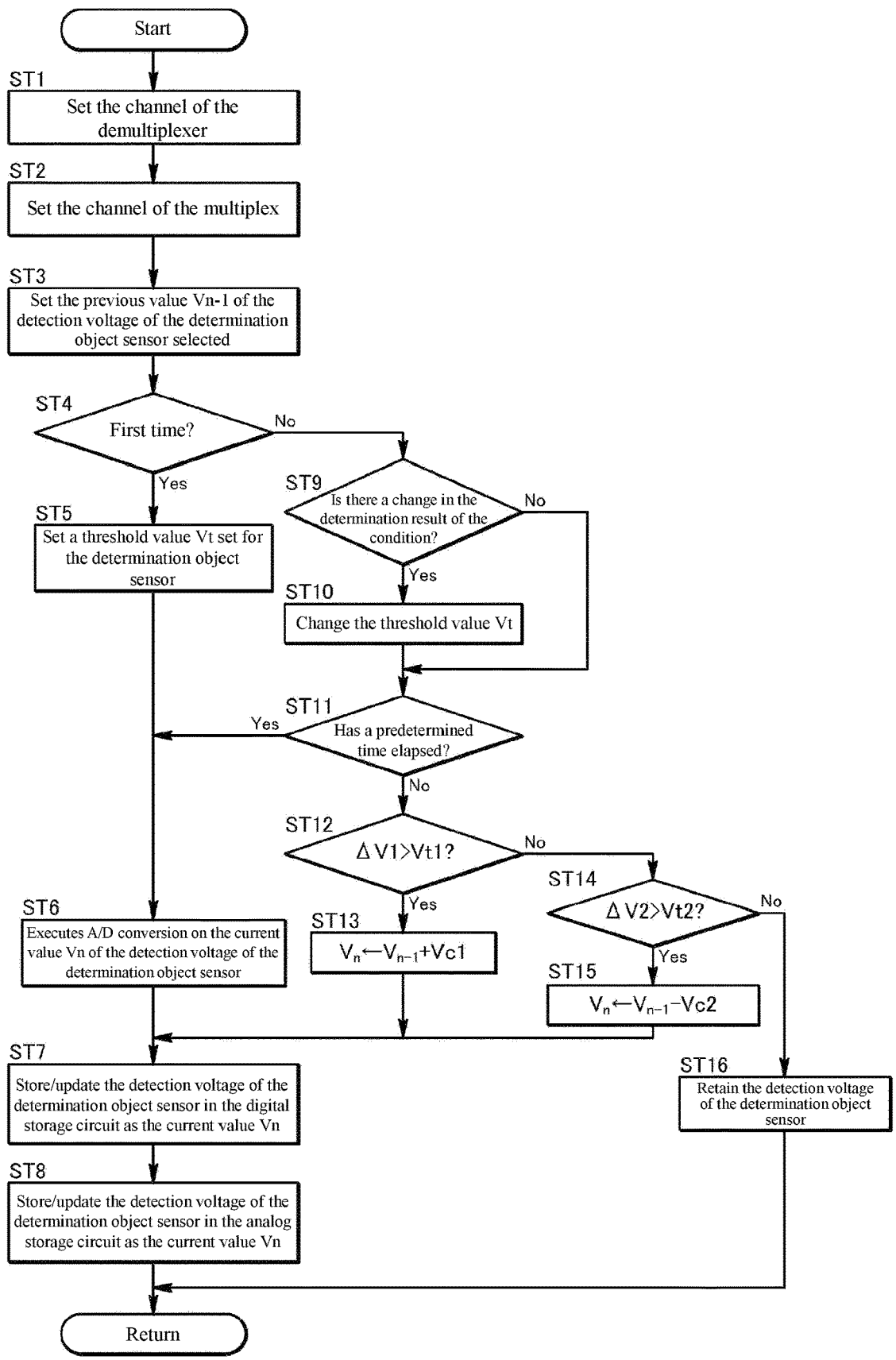
FIG. 2 is a flow chart of a data acquisition processing executed by a control unit.

The first embodiment of the disclosure will be described with reference to FIGS. 1 and 2. FIG. 1 is a block diagram showing a schematic configuration of a data acquisition device 1 according to the first embodiment. The data acquisition device 1 includes a sensor device 2 that detects a predetermined physical quantity as analog data at each predetermined sampling cycle, a controller 3 that acquires a physical quantity as digital data based on a physical quantity as analog data output from the sensor device 2, and a determination circuit 4.

The sensor device 2 includes a sensor unit 6 connected to a power supply 5. The sensor unit 6 has at least one sensor 7 (sensor unit). In this embodiment, the sensor unit 6 has a matrix structure of four channels in the Y direction and eight channels in the X direction, and includes a total of thirty-two sensors 7 arranged on a plane. Each sensor 7 detects a predetermined physical quantity as analog data. The predetermined physical quantity may be, for example, pressure, load, strain, temperature, or the like, and an analog electric signal corresponding to these physical quantities is output. The sensor 7 of this embodiment is supplied with a predetermined applied voltage (i.e. 5V) from the power supply 5, and outputs a detection voltage according to the pressure. The sensor unit 6 has a high spatial resolution by including a plurality of sensors 7.

The sensor device 2 includes a demultiplexer 8 provided on signal lines connecting the power supply 5 and the sensor unit 6, a multiplexer 9 provided on the signal lines connecting the sensor unit 6 and the controller 3, a low-pass filter 10, and an amplifier 11. The demultiplexer 8 sequentially switches the channel to which the applied voltage is to be supplied from the power supply 5 between the above four channels according to the command from the controller 3. The multiplexer 9 sequentially switches the channel to which the detection voltage is to be output from the sensor unit 6 between the eight channels according to the command from the controller. The sensor device 2 sequentially outputs the detection voltages of the thirty-two sensors 7 at every predetermined sampling cycle by switching the demultiplexer 8 and the multiplexer 9 by the controller 3.

The controller 3 is an electronic processing device including a CPU, a ROM, a RAM, and the like. The controller 3 includes an A/D converter 12, a control unit 13, and a digital storage circuit 14. The A/D converter 12 converts an analog electric signal into a digital electric signal. The control unit 13 controls the execution of A/D conversion by the A/D converter 12. The digital storage circuit 14 stores the physical quantity as digital data detected by the sensor device 2 and converted by the A/D converter 12. The controller 3 may be configured as one piece of hardware, or may be configured as a unit composed of a plurality of pieces of hardware.

The digital storage circuit 14 is composed of a ROM, RAM, or the like, and stores a physical quantity as digital data (in this embodiment, a detection voltage corresponding to pressure). The digital storage circuit 14 stores the detection voltage for each sensor 7. The detection voltage stored in the digital storage circuit 14 is erased when the data acquisition device 1 is stopped. Therefore, when the data acquisition device 1 is started, the digital storage circuit 14 does not retain the previous value of the detection voltage for each sensor 7. The digital storage circuit 14 stores a preset initial value of the detection voltage, and it is preferable to reset the initial value to the detection voltage when the data acquisition device 1 is started. The initial value is set according to an assumed usage environment of the data acquisition device 1 and is stored in the digital storage circuit 14.

Further, the digital storage circuit 14 stores a first threshold value Vt1 and a second threshold value Vt2, which will be described later, in addition to the detection voltage. The digital storage circuit 14 may store the first threshold value Vt1 and the second threshold value Vt2 for each sensor 7, or may store the first threshold value Vt1 and the second threshold value Vt2 as common values for all the sensors 7. In this embodiment, the first threshold value Vt1 and the second threshold value Vt2 are set to common values for all the sensors 7. On the other hand, the first threshold value Vt1 and the second threshold value Vt2 are stored in association with the condition as values that change according to the condition. In other embodiments, the first threshold value Vt1 and the second threshold value Vt2 may be set to constant values. In this embodiment, the first threshold value Vt1 and the second threshold value Vt2 are values whose polarities are different from each other and whose absolute values are the same as each other.

For example, the A/D converter 12 performs comparison processing a plurality of times by a method according to a sequential comparison type, and converts analog data into digital data represented by a multi-bit (i.e. 10-bit) A/D conversion result. The A/D converter 12 executes A/D conversion at a predetermined timing according to a command from the control unit 13. The detection voltage converted into digital data is stored in the digital storage circuit 14 in association with the sensor 7. As will be described later, the A/D converter 12 of this embodiment executes A/D conversion at a timing corresponding to the sampling cycle only when an execution command is received from the control unit 13, and does not execute A/D conversion at other timings.

The control unit 13 is configured by a CPU, reads a program stored in a ROM or the like, and executes arithmetic processing according to the program so as to execute various controls. For example, the control unit 13 outputs a switching command to the demultiplexer 8 and the multiplexer 9 at the timing synchronized with the sampling cycle, such that the detection voltage as analog data detected by the thirty-two sensors 7 is sequentially output to the sensor device 2. The detection voltage as analog data output from the sensor device 2 (current value Vn of the detection voltage of each sensor 7) is supplied to the A/D converter 12 of the controller 3 and the determination circuit 4.

Further, the control unit 13 supplies the voltage as digital data corresponding to the physical quantity as well as the predetermined first threshold value Vt1 and second threshold value Vt2 as digital data stored in the digital storage circuit 14 to the determination circuit 4. The control unit 13 supplies a previous value Vn−1 of the voltage corresponding to the physical quantity as digital data of the corresponding sensor 7 for each sampling cycle. That is, the control unit 13 switches the previous value Vn−1 of the detection voltage as digital data supplied to the determination circuit 4 to that of the corresponding sensor 7 in synchronization with the switching timing of the demultiplexer 8 and the multiplexer 9. Further, the control unit 13 supplies the first threshold value Vt1 and the second threshold value Vt2 to the determination circuit 4 each time the change is made according to conditions.

Moreover, of the current value Vn of the detection voltage as analog data of each sensor 7 sequentially output from the sensor device 2, the control unit 13 decides the analog data on which the A/D converter 12 should execute A/D conversion, and controls the execution of A/D conversion by the A/D converter 12.

The determination circuit 4 includes an analog storage circuit 15, a first difference circuit 16, a second difference circuit 17, a first comparison circuit 18, a second comparison circuit 19, a first threshold value circuit 20, and a second threshold value circuit 21.

The analog storage circuit 15 may be, for example, a sample and hold circuit including an operational amplifier and a switch. The analog storage circuit 15 samples the detection voltage as analog data input from the sensor device 2, and retains the sampled detection voltage constant as the previous value Vn−1. Further, in this embodiment, the analog storage circuit 15 updates the stored detection voltage with a value of the detection voltage as digital data supplied from the control unit 13. The analog storage circuit 15 is provided according to the number of sensors 7. The detection voltage stored in the analog storage circuit 15 is used as the previous value Vn−1 in the subsequent sampling cycle of the corresponding sensor 7. In another embodiment, the analog storage circuit 15 may continue to retain the previous value Vn−1 of the detection voltage without updating.

The first difference circuit 16 and the second difference circuit 17 output the difference between two analog data. To be specific, the first difference circuit 16 calculates a first difference voltage $\Delta V1$ ($=Vn-Vn-1$) by subtracting the previous value Vn−1 of the detection voltage input from the analog storage circuit 15 from the current value Vn of the detection voltage input from the sensor device 2. The second difference circuit 17 calculates a second difference voltage $\Delta V2$ ($=Vn-1-Vn$) by subtracting the current value Vn of the detection voltage input from the sensor device 2 from the previous value Vn−1 of the detection voltage input from the analog storage circuit 15. The second difference voltage $\Delta V2$ is a value obtained by inverting the polarity of the first difference voltage $\Delta V1$ ($\Delta V2=-\Delta V1$).

The first comparison circuit 18 and the second comparison circuit 19 compare two analog data and output a comparison result. To be specific, the first comparison circuit 18 compares the first difference voltage $\Delta V1$ with the first threshold value Vt1 supplied from the first threshold value circuit 20. When the first threshold value Vt1 is a positive value and the first difference voltage $\Delta V1$ exceeds the first threshold value Vt1 ($\Delta V1>Vt1$), the first comparison circuit 18 outputs a positive event signal indicating an increase in the detection voltage as the pressure acting on the sensor 7 increases. The second comparison circuit 19 compares the second difference voltage $\Delta V2$ with the second threshold value Vt2 supplied from the second threshold value circuit 21. When the second threshold value Vt2 is a negative value and the second difference voltage $\Delta V2$ falls below the second threshold value Vt2 ($\Delta V2<Vt2$), the first comparison circuit 18 outputs a negative event signal indicating a decrease in the detection voltage as the pressure acting on the sensor 7 decreases. The positive event signal and the negative event signal are input to the control unit 13.

The determination circuit 4 executes these processings for each sensor 7 at a timing synchronized with the switching timing of the demultiplexer 8 and the multiplexer 9.

When a predetermined condition such as a positive event signal input and negative event signal input is satisfied, the control unit 13 changes the first threshold value Vt1 of the first threshold value circuit 20 and the second threshold value Vt2 of the second threshold value circuit 21. The predetermined condition includes that the current value Vn of the detection voltage as digital data is different from the initial value. When a predetermined condition is satisfied, the control unit 13 changes the first threshold value Vt1 and the second threshold value Vt2 to a value having a small absolute value. When the predetermined condition is no longer satisfied, the control unit 13 changes the first threshold value Vt1 and the second threshold value Vt2 to a value having a large absolute value. The control unit 13 may change the first threshold value Vt1 and the second threshold value Vt2 step by step, or may change them all at once. The first threshold value circuit 20 and the second threshold value circuit 21 may be a storage circuit that stores the voltages of the first threshold value Vt1 and the second threshold value Vt2 as analog data, or may be a D/A converter. When a storage circuit for storing analog data is used, the control unit 13 is able to change the first threshold value Vt1 and the second threshold value Vt2 at high speed by GPIO (general purpose input/output). Further, the control unit 13 controls by GPIO to update the detection voltage stored in the analog storage circuit 15 with the value of the detection voltage as digital data stored in the digital storage circuit 14. Therefore, the detection voltage as analog data is updated at high speed, and the decrease in the sampling frequency is suppressed.

When a positive event signal is input, the control unit 13 adds a predetermined first change amount Vc1 to the detection voltage of the corresponding sensor 7 stored in the digital storage circuit 14, and updates the detection voltage of the corresponding sensor 7 with the calculated value. That is, the control unit 13 stores the value obtained by adding the first change amount Vc1 to the previous value Vn−1 of the detection voltage stored in the digital storage circuit 14 as the current value Vn of the detection voltage in the digital storage circuit 14. The first change amount Vc1 is set to the same value as the first threshold value Vt1 (Vc1=Vt1). When the first threshold value Vt1 is changed, the control unit 13 changes the first change amount Vc1 to be added to the detection voltage so as to match the first threshold value Vt1.

When a negative event signal is input, the control unit 13 updates the detection voltage of the corresponding sensor 7 with a value obtained by subtracting a predetermined second change amount Vc2 from the detection voltage of the corresponding sensor 7 stored in the digital storage circuit 14. That is, the control unit 13 stores the value obtained by subtracting the second change amount Vc2 from the previous value Vn−1 of the detection voltage stored in the digital storage circuit 14 as the current value Vn of the detection voltage in the digital storage circuit 14. The second change amount Vc2 is set to a value obtained by inverting the polarity of the second threshold value Vt2 (Vc2=−Vt2=Vt1=Vc1). When the second threshold value Vt2 is changed, the control unit 13 changes the second change amount Vc2 to be subtracted from the detection voltage so as to match the second threshold value Vt2.

As described above, since the first threshold value Vt1 and the second threshold value Vt2 are values whose polarities are different from each other and whose absolute values are the same as each other, the first change amount Vc1 and the second change amount Vc2 are also values whose polarities are different from each other and whose absolute values the same as each other.

If neither the positive event signal nor the negative event signal is input, the control unit 13 does nothing. That is, the previous value Vn−1 of the detection voltage of the corresponding sensor 7 stored in the digital storage circuit 14 is retained in the digital storage circuit 14 as the current value Vn.

In this manner, when the detection voltage corresponding to the pressure changes from the previous value Vn−1 to a plus side beyond the first threshold value Vt1 or to the minus side below the second threshold value Vt2, the control unit 13 updates the detection voltage of the digital storage circuit 14. To be specific, the control unit 13 stores the value obtained by adding the first change amount Vc1 to or subtracting the second change amount Vc2 from the previous value Vn−1 of the detection voltage in the digital storage circuit 14 as the current value Vn of the detection voltage. That is, the detection voltage is updated without executing A/D conversion by the A/D converter 12.

The control unit 13 updates the current value Vn of the detection voltage of the corresponding sensor 7 stored in the analog storage circuit 15 with the current value Vn of the detection voltage calculated for storage in the digital storage circuit 14, for the following reasons. In other words, even when the current value Vn of the detection voltage as analog data changes significantly, the current value Vn of the detection voltage stored in the digital storage circuit 14 is updated with the first change amount Vc1 or the second change amount Vc2. Therefore, the detection voltage as digital data may deviate from the actual detection voltage as analog data. In order to prevent this, the control unit 13 updates the detection voltage as analog data so as to match the detection voltage as digital data.

The data acquisition device 1 may be used, for example, as a contact sensor in which the sensor unit 6 is provided on the skin of a robot's hand to detect contact with a substance. The data acquisition device 1 outputs the acquired digital data of each sensor 7 to a higher-level computer. When each sensor 7 does not detect contact (the first difference voltage ΔV1 does not exceed the first threshold value Vt1 and the second difference voltage ΔV2 does not fall below the second threshold value Vt2), even if the number of sensors 7 is large, the processing load of the control unit 13 is small. Therefore, the responsiveness of the robot does not deteriorate due to long data acquisition time (sampling cycle). Moreover, the amount of data processed by the control unit 13 does not become enormous and communication is not overwhelmed.

If the contact pressure does not change even when each sensor 7 detects contact, in the next sampling cycle, the first difference voltage ΔV1 does not exceed the first threshold value Vt1, and the second difference voltage ΔV2 does not fall below the second threshold value Vt2. Therefore, the control unit 13 does not execute A/D conversion by the A/D converter 12, and retains the previous value Vn−1 as the current value Vn. Therefore, the processing load of the control unit 13 is also reduced.

Next, the data acquisition processing executed by the control unit 13 will be described with reference to FIG. 2. FIG. 2 is a flow chart of a data acquisition processing executed by the control unit 13. As shown in FIG. 2, once started, the control unit 13 executes the next routine at predetermined sampling cycles.

First, the control unit 13 sets the channel of the demultiplexer 8 (step ST1). In this embodiment, the control unit 13 sequentially switches the four channels of the demultiplexer 8 every eight routines. Next, the control unit 13 sets the channel of the multiplexer 9 (step ST2). In this embodiment, the control unit 13 sequentially switches the eight channels of the multiplexer 9 for each routine. As a result, the thirty-two sensors 7 are sequentially switched for each routine. Either Step ST1 or step ST2 may be performed first.

Subsequently, the control unit 13 sets the previous value Vn−1 of the detection voltage of the determination object sensor 7 selected by step ST1 and step ST2 (step ST3). To be specific, the control unit 13 selects such that the previous value Vn−1 of the detection voltage is supplied from the analog storage circuit 15 corresponding to the determination object sensor 7 by the GPIO.

The control unit 13 determines whether or not this routine is the first time for the determination object sensor 7, namely, whether or not it is the first sampling after the data acquisition device 1 is started (step ST4). When this routine is the first time (step ST4: Yes), the control unit 13 sets a threshold value Vt set for the determination object sensor 7 (step ST5). To be specific, the control unit 13 acquires the first threshold value Vt1 and the second threshold value Vt2 set for the determination object sensor 7 from the digital storage circuit 14, and sets these values in the first threshold value circuit 20 and the second threshold value circuit 21.

After that, the control unit 13 executes A/D conversion on the current value Vn of the detection voltage of the determination object sensor 7 by the A/D converter 12 and acquires the current value Vn of the detection voltage as digital data (step ST6). Subsequently, the control unit 13 stores the current value Vn of the detection voltage as digital data in the digital storage circuit 14 as the current value Vn of the detection voltage of the determination object sensor 7 (step ST7). Further, the control unit 13 stores the current value Vn of the detection voltage as digital data in the analog storage circuit 15 as the current value Vn of the detection voltage of the determination object sensor 7 (step ST8), and repeats the above procedure.

In step ST4, if this routine is not the first time, the control unit 13 determines whether or not there is a change in the determination result of the predetermined condition (step ST9). The predetermined condition includes that the current value Vn of the detection voltage as digital data is different from the initial value. When the predetermined condition changes from the unsatisfied state to the satisfied state, and when the predetermined condition changes from the satisfied state to the unsatisfied state, the determination in step ST9 is Yes. If the determination in step ST9 is Yes, the control unit 13 changes the first threshold value Vt1 and the second threshold value Vt2 (step ST10). To be specific, when the determination in step ST9 is Yes for the former reason, the control unit 13 changes the first threshold value Vt1 and the second threshold value Vt2 such that the absolute value becomes smaller. If the determination in step ST9 is Yes for the latter reason, the control unit 13 changes the first threshold value Vt1 and the second threshold value Vt2 such that the absolute value becomes larger.

Subsequently, the control unit 13 determines whether or not a predetermined time has elapsed from A/D conversion in step ST6 (step ST11). When the predetermined time has elapsed (step ST11: Yes), the control unit 13 advances the processing to A/D conversion in step ST6.

When the predetermined time has not elapsed (step ST11: No), the control unit 13 determines whether or not the first difference voltage ΔV1 exceeds the first threshold value Vt1 (step ST12). When the first difference voltage ΔV1 exceeds the first threshold value Vt1 (step ST12: Yes), the control unit 13 adds the first change amount Vc1 to the detection voltage as digital data stored in the digital storage circuit 14, and calculates it as the current value Vn of the detection voltage (step ST13). In step ST12, when the first difference voltage ΔV1 does not exceed the first threshold value Vt1 (No), the control unit 13 determines whether or not the second difference voltage ΔV2 falls below the second threshold value Vt2 (step ST14). When the second difference voltage ΔV2 falls below the second threshold value Vt2 (step ST14: Yes), the control unit 13 subtracts the second change amount Vc2 from the detection voltage as digital data stored in the digital storage circuit 14 and calculates it as the current value Vn of the detection voltage (step ST15).

After the processing of step ST13 and step ST15, the control unit 13 advances the processing to step ST7. To be specific, the control unit 13 updates the current value Vn of the digital storage circuit 14 with the current value Vn of the calculated detection voltage (step ST7), updates the current value Vn of the analog storage circuit 15 with the current value Vn of the calculated detection voltage (Step ST8), and repeats the above processing.

When the second difference voltage ΔV2 does not fall below the second threshold value Vt2 in step ST14 (No), the control unit 13 does not perform any processing, that is, retains the current value Vn of the digital storage circuit 14 and the analog storage circuit 15 (step ST16), and repeats the above processing.

In this manner, when the detection voltage corresponding to the pressure changes from the previous value Vn−1 to the plus side beyond the first threshold value Vt1 or to the minus side below the second threshold value Vt2, the control unit 13 stores the value obtained by adding the first change amount Vc1 to or subtracting the second change amount Vc2 from the previous value Vn−1 of the detection voltage in the digital storage circuit 14 as the current value Vn of the detection voltage. That is, since the detection voltage corresponding to the pressure may be updated without executing A/D conversion by the A/D converter 12, the decrease in the sampling frequency is suppressed. Further, conventionally, the data difference calculation and data comparison performed by the control unit 13 are performed, respectively by the first difference circuit 16, the second difference circuit 17, the first comparison circuit 18, and the second comparison circuit 19, which are analog circuits, respectively, and it is not necessary for the control unit 13 to perform these processings. Therefore, the processing load of the control unit 13 is reduced. Further, since it is not necessary to perform a processing requiring a long processing time such as D/A conversion for the comparison processing performed in the analog circuit, the decrease in the sampling frequency is also suppressed.

In this embodiment, the data acquisition device 1 includes the A/D converter 12. At startup (ST4: Yes), the control unit 13 makes the A/D converter 12 execute A/D conversion (ST6), and converts the current value Vn of the detection voltage detected as analog data into digital data. After that, the control unit 13 stores the converted value in the digital storage circuit as the current value Vn of the detection voltage 14 (ST7). As a result, by executing A/D conversion by the A/D converter 12 at startup, the current value Vn of the detection voltage, that is, the initial value can be accurately acquired as digital data and stored in the digital storage circuit 14.

In this embodiment, the control unit 13 makes the A/D converter 12 execute A/D conversion (ST6) at a predetermined timing (ST11: Yes) after the start-up, and converts the current value Vn of the detection voltage detected as analog data into digital data. After that, the control unit 13 corrects the value stored in the digital storage circuit 14 by storing the converted value in the digital storage circuit 14 as the current value Vn of the detection voltage (ST7). In this manner, even if the value of the detection voltage calculated by the addition of the first change amount Vc1 or the subtraction of the second change amount Vc2 deviates from the actual value, the current value Vn of the detection voltage is corrected to an accurate value by the A/D converter 12 executing A/D conversion at a predetermined timing.

In this embodiment, the first change amount Vc1 is a value same as the first threshold value Vt1, and the second change amount Vc2 is a value (−Vt2) obtained by reversing the polarity of the second threshold value Vt2. As a result, when the first difference voltage ΔV1 exceeds the first threshold value Vt1, that is, when the current value Vn of detection voltage as analog data is significantly increased from the previous value Vn−1 beyond the first threshold value Vt1, the detection voltage as digital data is changed and increased by as much as the first threshold value Vt1. Further, when the second difference voltage ΔV2 falls below the second threshold value Vt2, that is, when the current value Vn as analog data detection voltage is significantly lower than the previous value Vn−1 by the second threshold value Vt2, the detection voltage as digital data is changed and reduced by as much as the second threshold value Vt2. Therefore, the detection voltage as digital data is not changed more than the actual change amount of the detection voltage.

In this embodiment, the control unit 13 updates the current value Vn of the detection voltage stored in the analog storage circuit 15 with the current value Vn of the detection voltage calculated to be stored in the digital storage circuit 14 (ST8). As a result, the detection voltage as analog data used as the previous value Vn−1 at the time of the next sampling matches the value of the detection voltage stored in the digital storage circuit 14. Therefore, even if the detection voltage as digital data is calculated by addition of the first change amount Vc1 or subtraction of the second change amount Vc2, it is possible to prevent the value of the calculated detection voltage from deviating significantly from the actual value.

According to a predetermined condition (ST9: Yes), the control unit 13 changes at least one of the first threshold value Vt1 and the second threshold value Vt2 (ST10). As a result, when a more accurate physical quantity as digital data is required or when a coarser physical quantity of digital data is satisfied, by setting the conditions, the physical quantity as digital data can be acquired with desired accuracy.

In this embodiment, the data acquisition device 1 includes the sensor unit 6 including a plurality of sensors 7 connected to the analog storage circuit 15 via the multiplexer 9, and the analog storage circuit 15 stores the detection voltage for each sensor 7. As a result, high spatial resolution is realized. Further, in step ST2, the control unit 13 switches the multiplexer 9 in synchronization with the switching of the detection voltage supplied to the first difference circuit 16 and the second difference circuit 17. As a result, it is possible to achieve both high spatial resolution and reduction of the processing load of the control unit 13.

Moreover, instead of having the A/D converter 12 execute A/D conversion (ST6) when the control unit 13 starts up (ST4: Yes), the digital storage circuit 14 may store a preset initial value of the detection voltage. As a result, the control unit 13 can acquire the initial value of the detection voltage stored in the digital storage circuit 14 from the digital storage circuit 14 without executing A/D conversion at startup. Therefore, the control unit 13 can acquire the initial value in a short time. This configuration is suitable when the physical quantity at the time of startup of the control unit 13 is fixed.

Second Embodiment

Next, a second embodiment of the disclosure will be described with reference to FIGS. 3 and 4. The same or similar elements as those in the first embodiment are designated by the same reference numerals, and redundant description will be omitted.

Figure 3:
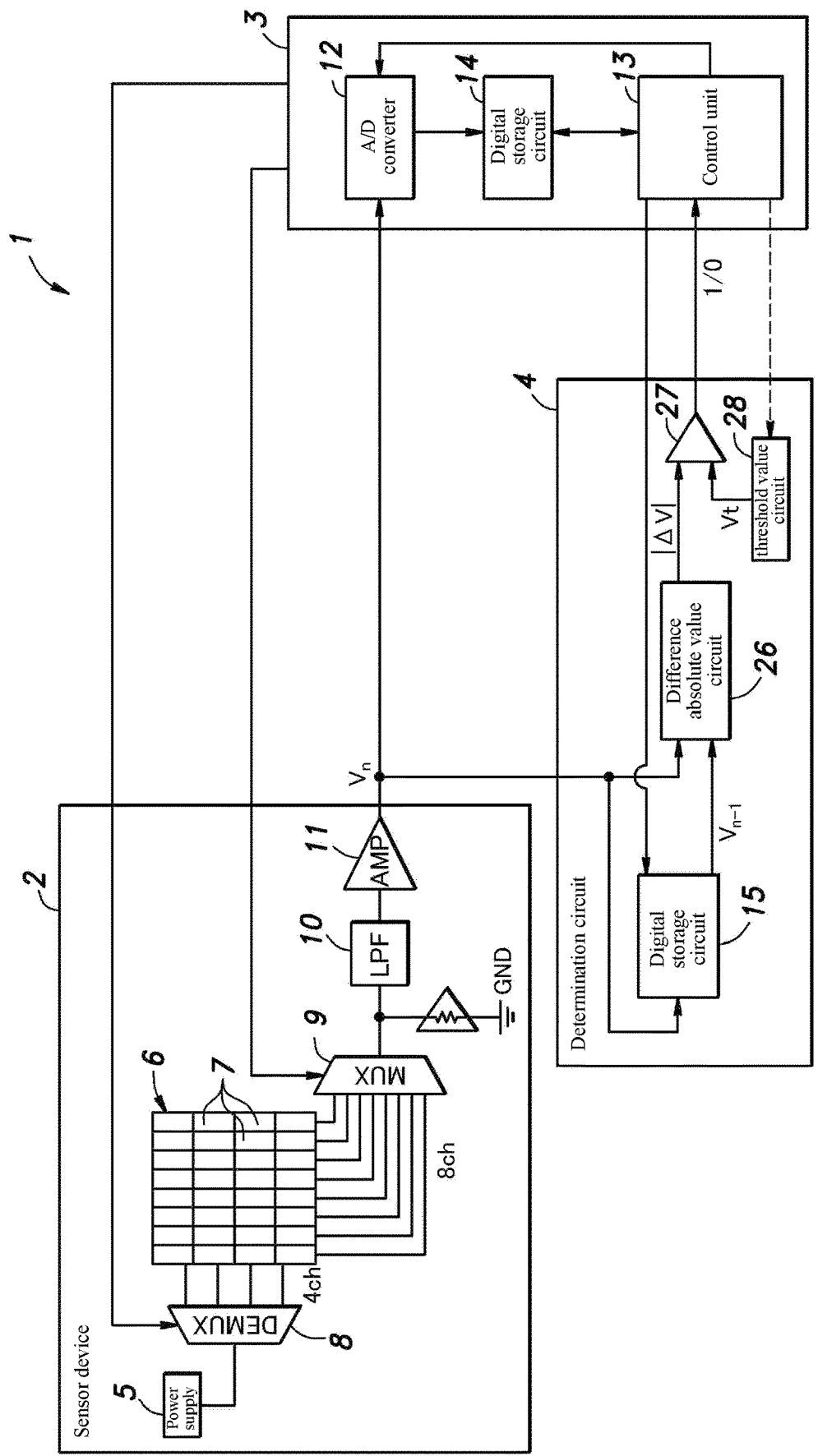
FIG. 3 is a block diagram showing a schematic configuration of a data acquisition device according to a second embodiment.

FIG. 3 is a block diagram showing a schematic configuration of the data acquisition device 1 according to the second embodiment. As shown in FIG. 3, in this embodiment, the configuration of the determination circuit 4 is different from that of the first embodiment. The determination circuit 4 includes the analog storage circuit 15, a difference absolute value circuit 26, a comparison circuit 27, and a threshold value circuit 28. The analog storage circuit 15 is the same as that of the first embodiment.

The difference absolute value circuit 26 outputs an absolute value of the difference between two analog data. To be specific, the difference absolute value circuit 26 calculates an absolute value |ΔV| (|ΔV|=|Vn−Vn−1|) of a difference voltage ΔV between the current value Vn of the detection voltage input from the sensor device 2 and the previous value Vn−1 of the detection voltage input from the analog storage circuit 15.

Figure 4:
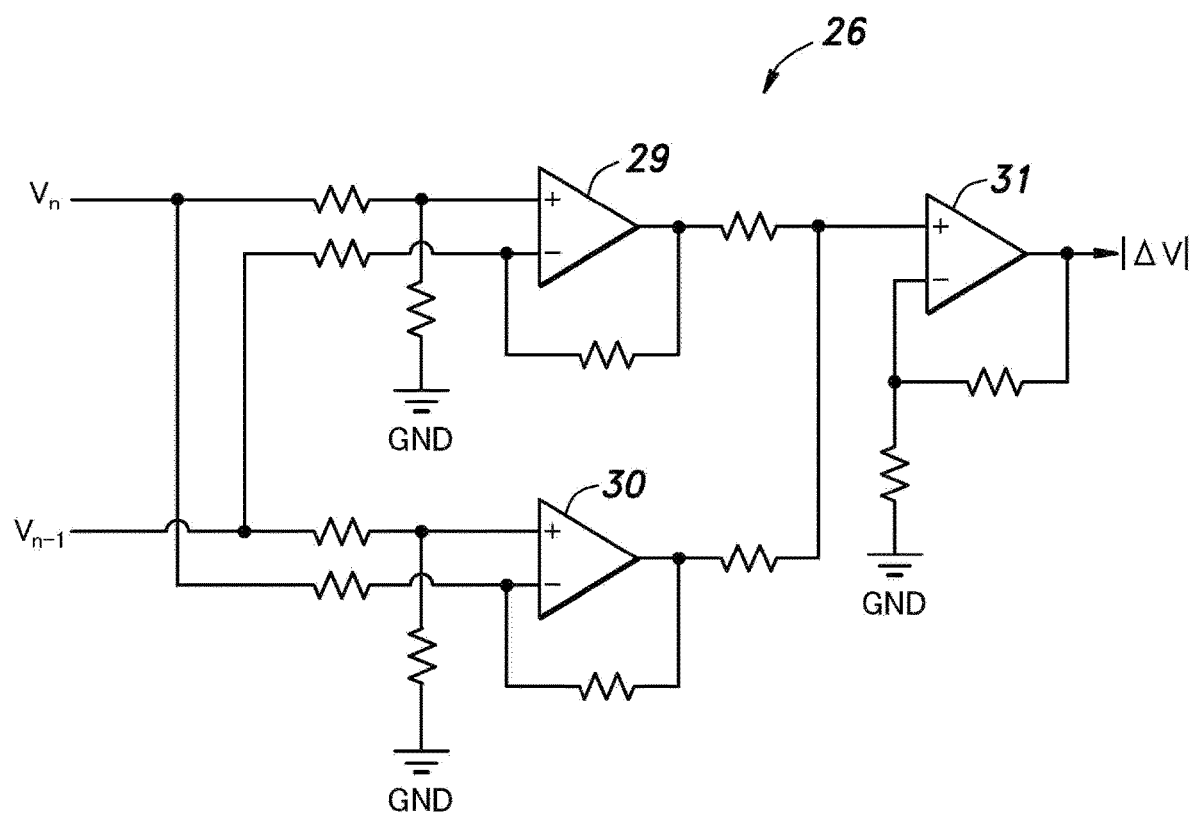
FIG. 4 is a circuit diagram showing a detailed configuration of a difference circuit shown in FIG. 3.

FIG. 4 is a circuit diagram showing a detailed configuration of the difference absolute value circuit 26 shown in FIG. 3. As shown in FIG. 2, the difference absolute value circuit 26 includes a first subtractor 29, a second subtractor 30, and an adder 31. The current value Vn of the detection voltage is input to the first subtractor 29 as an added value, and the previous value Vn−1 of the detection voltage is input as a subtracted value. The previous value Vn−1 of the detection voltage is input to the second subtractor 30 as an added value, and the current value Vn of the detection voltage is input as the subtracted value. The output of the first subtractor 29 and the output of the second subtractor 30 are input to the adder 31. When the current value Vn of the detection voltage is larger than the previous value Vn−1 (Vn>Vn−1), the first subtractor 29 outputs a value (Vn−Vn−1) obtained by subtracting the previous value Vn−1 from the current value Vn. When the current value Vn of the detection voltage is smaller than the previous value Vn−1 (Vn<Vn−1), the second subtractor 30 outputs a value (Vn−1−Vn) obtained by subtracting the current value Vn from the previous value Vn−1. The adder 31 outputs the absolute value |ΔV| of the difference voltage ΔV by adding the output of the first subtractor 29 and the output of the second subtractor 30.

Returning to FIG. 3, the comparison circuit 27 compares the two analog data and outputs a comparison result. To be specific, the comparison circuit 27 compares the absolute value |ΔV| of the difference voltage ΔV with the threshold value Vt provided from the threshold value circuit 28. The threshold value Vt is a positive value. When the absolute value |ΔV| of the difference voltage ΔV exceeds the threshold value Vt (|ΔV|>Vt), the comparison circuit 27 outputs "1" indicating an increase in the detection voltage as the pressure acting on the sensor 7 increases. When the absolute value |ΔV| of the difference voltage ΔV does not exceed the threshold value Vt (|ΔV|≤Vt), the comparison circuit 27 outputs "0" indicating that the pressure acting on the sensor 7 has not changed.

When "1" is input from the determination circuit 4, the control unit 13 receives, the control unit 13 adds a predetermined change amount Vc to the detection voltage of the corresponding sensor 7 stored in the digital storage circuit 14, and updates the detection voltage of the corresponding sensor 7 with the calculated value. When "0" is input from the determination circuit 4, the control unit 13 does not perform any processing. That is, the previous value Vn−1 of the detection voltage of the corresponding sensor 7 stored in the digital storage circuit 14 is retained in the digital storage circuit 14 as the current value Vn.

When "1" is input from the determination circuit 4, the control unit 13 changes the threshold value Vt of the threshold value circuit 28. The control unit 13 may change, for example, the threshold value Vt to a smaller value. The first threshold value Vt1 and the second threshold value Vt2 are changed to values having a small absolute value. Thereby, when a more accurate physical quantity as digital data is required, the physical quantity as digital data can be acquired with desired accuracy.

Thus, in this embodiment, the data acquisition device 1 includes the difference absolute value circuit 26 for calculating the absolute value |ΔV| of the difference between the current value Vn of the detection voltage detected as analog data and the previous value Vn−1 of the detection voltage stored in the analog storage circuit 15. That is, it is equivalent to the case of the first embodiment where the first threshold value Vt1 and the second threshold value Vt2 are values whose absolute values are the same as each other and whose polarities are different from each other (Vt1=−Vt2=Vt). As a result, although the rate of change of the detection voltage as digital data (change amount per sampling cycle) cannot be made different when the detection voltage increases or decreases, it is possible to shorten the sampling cycle by reducing the number of processings with a simple circuit configuration.

This concludes the description of the specific embodiment, but the disclosure may be widely modified without being limited to the above embodiment. For example, in the above embodiment, the data acquisition device 1 has been described as being used as a contact sensor for a robot as an example, but the data acquisition device 1 may be widely applied to more than just robots. Further, the specific configuration and arrangement of each member and portion, the quantity, the predetermined procedure, and the like may be appropriately changed as long as they do not deviate from the gist of the disclosure. On the other hand, not all of the components shown in the above embodiments are necessarily required, and they may be selected as appropriate.

According to this configuration, when the physical quantity changes from the previous value to the plus side beyond the first threshold value or to the minus side below the second threshold value, the control unit stores the value obtained by adding the first change amount to or subtracting the second change amount from the previous value of the physical quantity in the digital storage circuit as the current value of the physical quantity. That is, the physical quantity can be updated without executing A/D conversion by the A/D converter, so a decrease in the sampling frequency is suppressed. Moreover, conventionally, the data difference calculation and data comparison performed by the control unit are respectively performed by the first difference circuit, the second difference circuit, and the comparison circuit, which are analog circuits, and now it is not necessary for the control unit to perform these processings. Therefore, the processing load of the control unit is reduced. Further, since it is not necessary to perform a processing requiring a long processing time such as D/A conversion for the comparison processing performed in the analog circuit, the decrease in the sampling frequency is also suppressed.

According to this configuration, the A/D converter executes A/D conversion at startup, such that the current value of the physical quantity, namely the initial value, can be accurately acquired as digital data and stored in the digital storage circuit.

According to this configuration, even if the value of the physical quantity calculated by adding the first change amount or subtracting the second change amount deviates from the actual value, when the A/D converter executes A/D conversion at a predetermined timing, the current value of the physical quantity is corrected to an accurate value.

According to this configuration, without executing A/D conversion at startup, the control unit can acquire the initial value of the physical quantity stored in the digital storage circuit from the digital storage circuit. Therefore, the control unit can acquire the initial value in a short time. This configuration is suitable when the physical quantity at the startup of the control unit is fixed.

According to this configuration, the physical quantity as digital data is not changed more than the change amount of the actual physical quantity.

According to this configuration, the physical quantity as analog data used as the previous value at the next sampling matches the value of the physical quantity stored in the digital storage circuit. Therefore, even if the physical quantity as digital data is calculated by adding the first change amount or subtracting the second change amount, it is possible to prevent the calculated physical quantity from deviating significantly from the actual value.

According to the configuration, the rate of change (the change amount per sampling cycle) of the physical quantity as digital data cannot be different between when the physical quantity increases and when it decreases, it is possible to shorten the sampling cycle by reducing the number of processings with a simple circuit configuration.

According to this configuration, when a more accurate physical quantity as digital data, or when a demand is satisfied by coarser physical quantity as digital data, the physical quantity as digital data can be acquired with desired accuracy by setting the condition.

According to this configuration, the sensor unit including a plurality of sensors can reduce the processing load of the control unit while realizing high spatial resolution.

Effects

As described above, according to the disclosure, it is possible to provide a data acquisition device capable of suppressing the decrease in the sampling frequency and reducing the processing load of the control unit.

What is claimed is:
1. A data acquisition device, comprising:
   at least one sensor that detects a predetermined physical quantity as analog data;
   an analog storage circuit that stores the physical quantity as analog data;
   a digital storage circuit that stores the physical quantity as digital data;
   a first difference circuit that calculates a first difference, which is a difference of a current value of the physical quantity detected as analog data with respect to a previous value of the physical quantity stored in the analog storage circuit;
   a second difference circuit that calculates a second difference, which is a difference of the previous value of the physical quantity stored in the analog storage circuit with respect to the current value of the physical quantity detected as analog data;

a comparison circuit that compares the first difference with a predetermined first threshold value and compares the second difference with a predetermined second threshold value; and a control unit that controls a memory of the digital storage circuit, wherein a control unit:

adds a preset first change amount to a previous value of the physical quantity stored in the digital storage circuit, and stores a calculated value in the digital storage circuit as a current value of the physical quantity, when the first difference exceeds the first threshold value;

subtracts a preset second change amount from the previous value of the physical quantity stored in the digital storage circuit, and stores a calculated value in the digital storage circuit as the current value of the physical quantity, when the second difference falls below the second threshold value; and retains the previous value of the physical quantity stored in the digital storage circuit in the digital storage circuit as the current value of the physical quantity, when the first difference is equal to or less than the first threshold value and the second difference is equal to or greater than the second threshold value.

2. The data acquisition device according to claim 1, further comprising:

an A/D converter that converts analog data to digital data, wherein, at startup, the control unit makes the A/D converter execute A/D conversion, converts the current value of the physical quantity detected as analog data into digital data, and stores a converted value in the digital storage circuit as the current value of the physical quantity.

3. The data acquisition device according to claim 2, wherein at a predetermined timing after startup, the control unit makes the A/D converter execute A/D conversion, converts the current value of the physical quantity detected as analog data into digital data, and, by storing a converted value in the digital storage circuit as the current value of the physical quantity, corrects the value stored in the digital storage circuit.

4. The data acquisition device according to claim 1, wherein the digital storage circuit stores a preset initial value of the physical quantity.

5. The data acquisition device according to claim 1, wherein the first change amount is the first threshold value, and the second change amount is a value obtained by reversing a polarity of the second threshold value.

6. The data acquisition device according to claim 2, wherein the first change amount is the first threshold value, and the second change amount is a value obtained by reversing a polarity of the second threshold value.

7. The data acquisition device according to claim 3, wherein the first change amount is the first threshold value, and the second change amount is a value obtained by reversing a polarity of the second threshold value.

8. The data acquisition device according to claim 4, wherein the first change amount is the first threshold value, and the second change amount is a value obtained by reversing a polarity of the second threshold value.

9. The data acquisition device according to claim 5, wherein the control unit updates the current value of the physical quantity stored in the analog storage circuit with the current value of the physical quantity calculated to be stored in the digital storage circuit.

10. The data acquisition device according to claim 6, wherein the control unit updates the current value of the physical quantity stored in the analog storage circuit with the current value of the physical quantity calculated to be stored in the digital storage circuit.

11. The data acquisition device according to claim 7, wherein the control unit updates the current value of the physical quantity stored in the analog storage circuit with the current value of the physical quantity calculated to be stored in the digital storage circuit.

12. The data acquisition device according to claim 8, wherein the control unit updates the current value of the physical quantity stored in the analog storage circuit with the current value of the physical quantity calculated to be stored in the digital storage circuit.

13. The data acquisition device according to claim 1, wherein the first threshold value and the second threshold value are values whose absolute values are the same as each other and whose polarities are different from each other, and the first difference circuit and the second difference circuit are absolute value circuits that calculate an absolute value of the difference between the current value of the physical quantity detected as analog data and the previous value of the physical quantity stored in the analog storage circuit.

14. The data acquisition device according to claim 1, wherein the control unit changes at least one of the first threshold value and the second threshold value.

15. The data acquisition device according to claim 1,
wherein the at least one sensor comprises a sensor unit comprising a plurality of the sensors connected to the analog storage circuit via a multiplexer,
the analog storage circuit stores the physical quantity for each sensor, and
the control unit switches the multiplexer in synchronization with switching of the physical quantity provided to the first difference circuit and the second difference circuit.

* * * * *